US005219377A

United States Patent [19]

Poradish

[11] Patent Number: 5,219,377

[45] Date of Patent: Jun. 15, 1993

[54] HIGH TEMPERATURE CO-FIRED CERAMIC INTEGRATED PHASED ARRAY PACKAGE

[75] Inventor: Frank J. Poradish, Plano, Tex.

[73] Assignee: Texas Instruments Incorporated, Dallas, Tex.

[21] Appl. No.: 927,893

[22] Filed: Aug. 10, 1992

Related U.S. Application Data

[62] Division of Ser. No. 822,392, Jan. 17, 1992.

[51] Int. Cl.[5] .......... H05K 3/36

[52] U.S. Cl. .......... 29/830; 29/832; 29/840; 333/247

[58] Field of Search .......... 29/830, 832, 840; 264/61; 333/247; 343/700 MS

[56] References Cited

U.S. PATENT DOCUMENTS 4,771,294 9/1988 Wasilousky .......... 361/388

4,899,118 2/1990 Polinski, Sr. .......... 333/247

*Primary Examiner*—P. W. Echols

*Assistant Examiner*—David P. Bryant

*Attorney, Agent, or Firm*—Rene' E. Grossman; Richard L. Donaldson

[57] ABSTRACT

A phased array package using a cofired ceramic material system to integrate antenna elements and an hermetic multi-chip MMIC cavity into a single module to provide incorporation of microwave circuit geometries into a system which has been used in the prior art only for low frequency applications. The integration provides a package very similar to a conventional integrated circuit package with substantial cost reductions over the complicated microwave assemblies of the present art.

9 Claims, 2 Drawing Sheets

HIGH TEMPERATURE CO-FIRED CERAMIC INTEGRATED PHASED ARRAY PACKAGE

This is a division of application Ser. No. 07/822,392, filed Jan. 17, 1992.

BACKGROUND OF THE INVENTION

1. Field of the Invention

This invention relates to high temperature co-fired ceramic integrated phased array packaging incorporating microwave circuitry, electronic circuitry, antenna or radiating element and transitions in a single package.

2. Brief Description of the Prior Art

High frequency microwave multichip packages have been produced in the prior with machined metal housings, generally of aluminum or kovar, with feed-throughs to introduce RF into or withdraw RF from the package. These prior art packages are multiple material systems fabricated using many different processing steps which are very costly since the packages cannot be fabricated in a fully automated operation in large quantity by such processing techniques.

Low temperature co-fired ceramic packages for microwave and millimeter wave gallium arsenide integrated circuits without antennas have also been developed as described in Polinski Pat. No. 4,899,118 and the references cited therein. In accordance with this procedure, an already fired substrate is provided for structural integrity and circuits are then built thereon in stacked layers in a low temperature co-fired format (about 800 to 1000° C.), each layer starting with low temperature "green" state materials that may have shrinkage and which is then processed in the "green" state (screen printing, via formation, etc.) with all layers then being fired together. Antennas or other radiating elements are not part of the system because sufficiently high structural integrity cannot be maintained in three dimensions with low temperature co-fired ceramic packages. Therefore, any antennas required are provided external to the package described in the patent.

A problem with low temperature co-fired packaging is that the materials used in low temperature co-firing have inferior microwave properties (higher loss tangent, lower reliability) than the materials that can be used in high temperature co-firing. Furthermore, low temperature co-firing techniques provide structures having inferior structural integrity than do equivalent structures fabricated using high temperature co-firing techniques themselves. The desire is to fabricate a total phased array package in a single material system and as a single package which includes therein integration of RF, digital, analog and antenna elements as well as other possible functions, such as I/O, which has superior microwave properties, improves reliability due to process step reductions and significantly reduces cost of manufacture.

SUMMARY OF THE INVENTION

In accordance with the present invention, the above noted desired results are provided using a standard high temperature co-fired process which operates from about 1500° C. to about 1800° C. and preferably about 1600° C. and is applied to the materials to be fabricated during the sintering step.

In the fabrication of microwave circuits, three dimensional properties must be considered, even though the circuitry itself is generally two dimensional in nature, because the field generated by the circuitry operates in three dimensions. The use of a high temperature co-fired process provides the ability to fabricate high precision three dimensional (thick) interconnects which are essential to high performance microwave circuits. In addition, circuit components such as inductors, capacitors and resistors can be fabricated directly into the microwave circuit structure in accordance with the present invention during the co-firing.

In general, a microwave circuit in accordance with the present is provided on plural ceramic layers which are positioned one atop the other. The components are formed on the surfaces of the "green" ceramic material layer with vias through the "green" ceramic material for interconnection with circuitry on ceramic layers therebelow. The "green" ceramic layers with components thereon are then stacked and fired together to form the final circuit.

To fabricate a microwave circuit in accordance with the present invention, the circuit to be implemented in three dimensional space itself is initially conceptualized with the processing limitations taken into account. This involves laying out the metallization pattern for the surface or surfaces of each ceramic layer for x-y axis circuitry to include microwave circuitry as well as resistors, inductors and capacitors to be formed on the ceramic layer surfaces and determining via locations to be placed through each ceramic layer to be built up for z-axis circuitry. An artwork pattern is then generated, one for the metallization and one for the via locations, this being done for each ceramic layer.

The ceramic materials that can be used are those that are preferably inexpensive, have predictable physical and chemical properties, have low loss at microwave frequencies, hold tolerances adequately for the intended use and have good thermal conductivity. Alumina, beryllia and aluminum nitride are preferred ceramics which have the above described properties. A molding material is formed by uniformly mixing fine particles of the ceramic material and an appropriate binder.

Each of the required ceramic layers is molded in "green" form in standard manner using the above described particulate ceramic material and the desired binder as is well known in the art. The vias are then formed in the "green" layers using the via artwork for that layer, the vias then being filled with an electrically conductive metal, typically tungsten. The metallization, typically tungsten, is then screen printed onto one or both of the major opposing surfaces of the "green" layers using the metallization artwork for that layer. The layer is then cured at slightly elevated temperature (<100° C.) so that the metallization is dried and will stick to the "green" ceramic layers for the duration of processing. Several different layers are produced in this manner as required for the final package. The several different layers are then built up individually, one atop the other, in a tooling device in the form of a package so that the layers are accurately positioned relative to each other and in contact with each other with minimal force being exerted on the layers to avoid movement of the particulate material.

The built up layers or package are than lightly pressed together so that the materials of adjacent "green" layers contact each other but are not under sufficient pressure to provide any appreciable particle movement. The package is then heated to the flow point or slightly thereabove of the binder being used so that the binder of adjacent layers joins and acts as a temporary adhesive to maintain the positions of the layers relative to each other. At this time, additional metallization can be added to the external side walls of the built up structure to provide shielding and the like.

A pre-firing is then applied to the package at a temperature sufficiently high but not high enough to cause substantial sintering and for a sufficient time to cause pyrolytic decomposition of most of the binder and cause shrinkage of the package. After sufficient binder is removed, the built up layers are heated to a temperature of about 1600° C. to cause removal of any remaining binder, completion of sintering of the ceramic material with some further shrinkage of the package and adhesion of the metallization to the ceramic material. The sintered built up layers are then cooled to produce the essentially finished part. Further processing of the exposed surfaces of the sintered structure can take place, such as plating, touch up, cutting or the like to provide the final desired hermetic structure. Additional metallization, typically molybdenum-manganese, may be applied after sintering and cooling with subsequent firing at a lower temperature, typically about 1200° C., prior to plating.

Alternatively, the circuit can be fabricated by molding the individual ceramic layers one atop the other in consecutive molding steps with metallization being deposited on and through each of the layers during layer fabrication. The vias are formed by insertion of inserts into the mold at appropriate locations when the layer requiring the vias is being molded. This procedure eliminates the requirement of the tooling device to hold the layers together until some adhesion between layers takes place during processing.

In accordance with the above described microwave device fabrication techniques, an antenna or radiating element can be incorporated into the final integrated structure. An antenna is merely a transition from a wire conducting medium to a space conducting medium. A key problem present in building microwave devices in the past has involved the interconnection of different components. The worst reliability problems have been located in the connectors and error sources generally appeared to emanate from interconnects. By integrating a reproducible antenna element into the unitary package, a new option for connection to that circuit is provided. One type of interconnect available in accordance with the present invention utilizes an electrically conductive elastomeric gasket which couples to, for example, a rectangular wave guide with antenna element therein via a rectangular opening in one side thereof to a circular waveguide at the other side thereof through a circular opening or vice versa, thereby providing a rectangular to circular transition or vice versa with a connectorless or metal-free connection. In this manner, microwave energy is fed from a feed device to the package or from the package to a further device with a plug together process which is reproducible, reliable and requires no soldering or welding process. This type of antenna is also beneficial in transition between an antenna and free space.

DESCRIPTION OF THE PREFERRED EMBODIMENT

Figure 1:
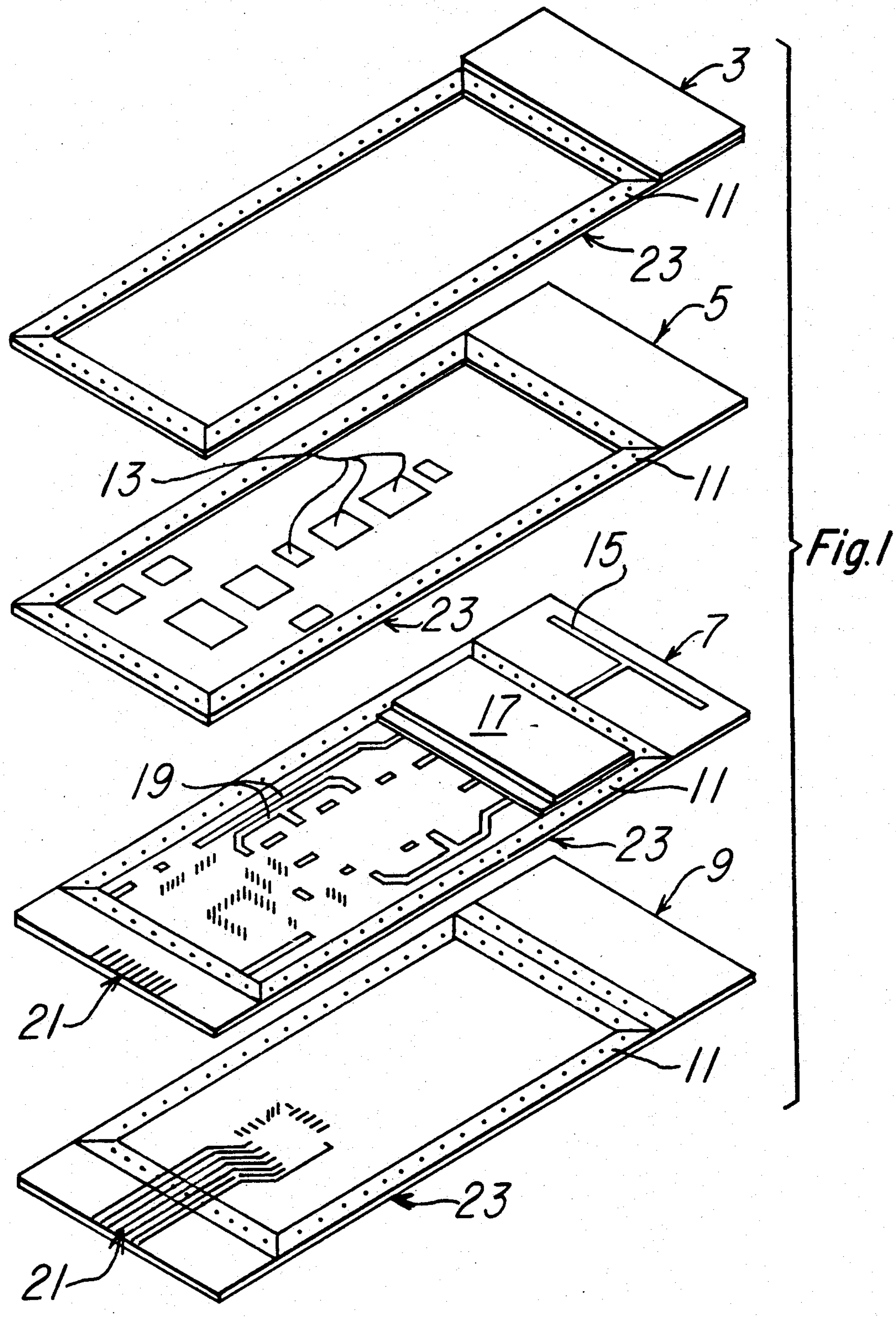
FIG. 1 is an exploded view of an RF microwave package in accordance with the present invention.

Referring to FIG. 1, there is shown an exploded view of an integrated RF microwave package in accordance with the present invention. The package 1 includes multiple layers 3, 5, 7 and 9 of ceramic and metallization, these layers being stackable one atop the other. The layers are preferably integral with each other in the completed package, but can also be in intimate contact with each other without being integral and preferably form an hermetic package. Each of the layers 3, 5, 7 and 9 is shown to have metallized vias 11 extending along the side walls thereof to provide RF shielding or other vertical interconnect function.

The layer 3 is generally circuit-free except for the vias 11 thereon and functions as an upper seal for the package when covered with a metallic or ceramic lid (not shown). A layer of metallization 23 can be disposed on the exterior or interior surface of layers 3, 5, 7 and 9 to provide grounding, shielding or I/O interfacing. Layers 3 and 5 contain cavities to provide space for integrated circuit chips 13.

The layer 7 may contain cavities therein which may or may not extend entirely therethrough. When such cavities extend through the layer 5 they may operate as vias and will have metallization therein (not shown) for interconnection with metallization on the layer 7 and/or the layer 3. The cavities can also contain semiconductor chips therein (not shown) which provide appropriate required circuit functions. The chips 13 are connected to metallization in the ceramic package typically with gold bond wires or soldered metal tabs. The layer 5 can also include metallization thereon (not shown) for interconnection with the chips and to perform other circuit functions. In addition, metallized vias 11 also extend around the side walls of layer 5 to provide RF and other circuitry as well as shielding.

The metallization on layer 7 includes thereon a radiating antenna element 15, which could be any radiating element type which, when coupled to a cavity, waveguide medium or free space will radiate (or absorb) RF energy. The antenna element 15 is connected to the internal circuitry (in this case a circulator 17) via metallization and/or wire bonding. In addition, plated metallization 23 extends around the side walls of the laminated package to provide a waveguide medium for directing the RF energy into space or a transition device. The side walls can be grooved with the metallization 23 disposed in the grooves as well as between the grooves. Also included on the layer 7 is a portion 21 which provides interconnect with equipment external to the package.

The layer 9 also operates as a lower seal for the package 1 and includes metallized vias 11 which extend around the side walls thereof. In addition, external plating 23 can be disposed on the inner and/or exterior surface of layer 9 to provide grounding, shielding or I/O interfacing.

Figure 2:
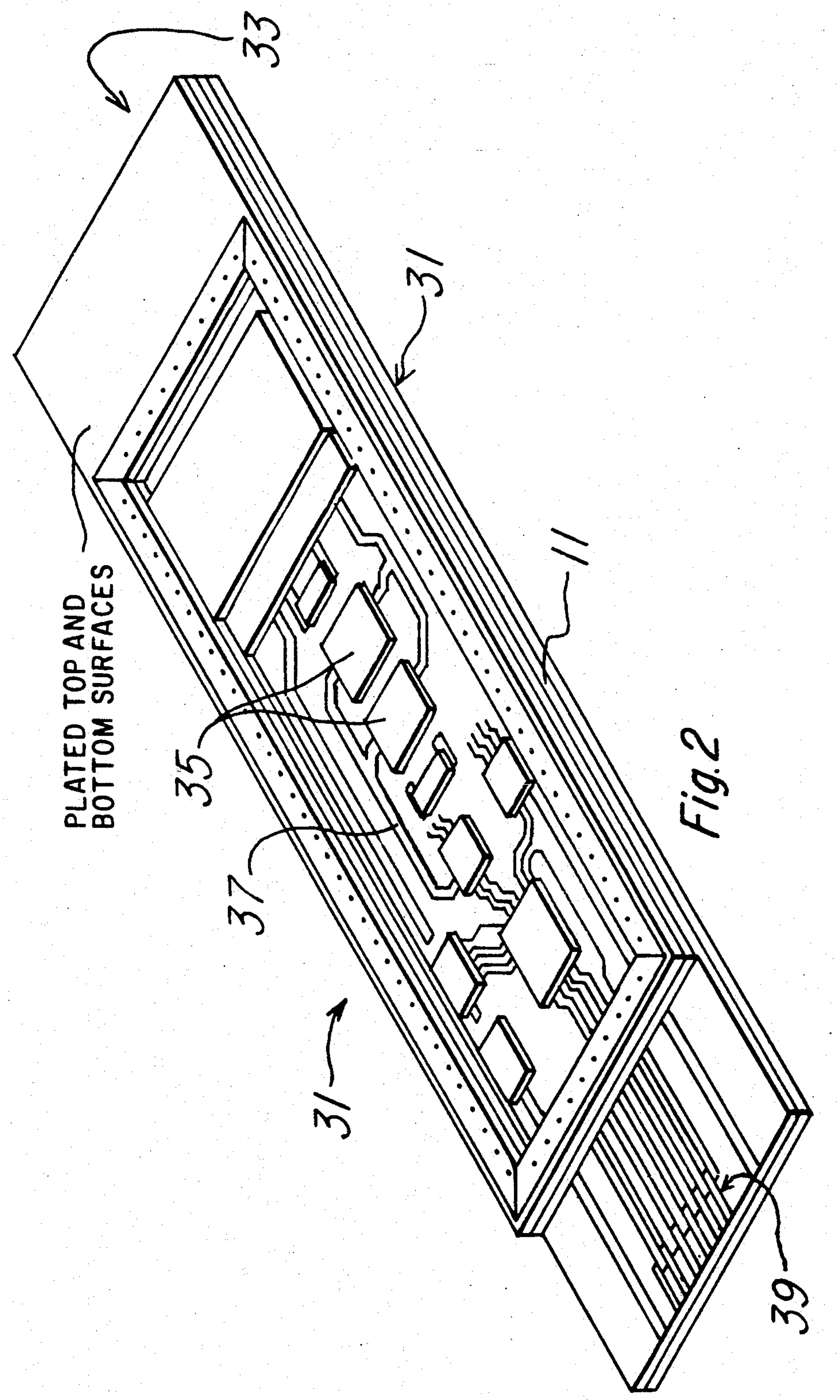
FIG. 2 is a perspective view of an integrated RF microwave package with an antenna element incorporated therein and the top layer removed which differs slightly from FIG. 1.

A completed four layer package 31 without a lid is shown in FIG. 2 and includes the antenna element 33 (not shown) buried between the second and third layers as in the embodiment of FIG. 1 with layers 3 and 5 thereover and layers 7 and 9 as shown in FIG. 1 thereafter. The circuitry is provided in chips 35 in the cavities with interconnects 37 coupled between cavities and the chips 35 therein. An I/O interconnect 39 is provided at the end of the package to provide interconnect with devices external to the package 31.

The package can be fabricated, for example, using the techniques described in the patent to Wiech (4,994,215) which is incorporated herein by reference or in the manner described hereinabove.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of making an integrated package which comprises the steps of:

(a) providing a plurality of stacked layers, each layer comprising uniformly mixed fine particulate ceramic material and a binder in intimate relation with each other, including top and bottom layers and at least one intermediate layer therebetween, each of said layers having a pair of opposing major surfaces;

(b) disposing a radiating antenna element on a major surface of said at least one intermediate layer;

(c) providing at least one cavity, having a semiconductor chip therein, in one of said top, bottom, and intermediate layers;

(d) disposing metallization on a major surface of said at least one intermediate layer coupling said chip and said antenna element;

(e) providing vias extending through the major surfaces of said at least one intermediate layer having electrically conductive material therein for interconnection with a layer intimate with said intermediate layer; and (f) cofiring said layers at a temperature of from about 1500° C. to about 1800° C. to remove said binder and cause sintering of said layers.

2. The method of claim 1 further including the step of forming metallized grooves in the side walls of said layers.

3. The method of claim 1 further including disposing metallization on a major surface of at least one of said top and bottom layers.

4. The method of claim 2 further including disposing metallization on a major surface of at least one of said top and bottom layers.

5. The method of claim 1 further including forming an interconnect at an edge portion of said intermediate layer coupled to said metallization.

6. The method of claim 2 further including forming an interconnect at an edge portion of said intermediate layer coupled to said metallization.

7. The method of claim 3 further including forming an interconnect at an edge portion of said intermediate layer coupled to said metallization disposed thereon.

8. The method of claim 4 further including forming an interconnect at an edge portion of said intermediate layer coupled to said metallization.

9. A method of making an integrated package which comprises the steps of:

(a) providing a plurality of stacked layers, each layer comprising uniformly mixed fine particulate ceramic material and a binder in intimate relation with each other, including top and bottom layers and at least one intermediate layer therebetween, each of said layers having a pair of opposing major surfaces;

(b) disposing a radiating antenna element on a major surface of said at least one intermediate layer;

(c) providing at least one cavity in one of said layers;

(d) disposing a semiconductor chip in said at least one cavity;

(e) disposing metallization on a major surface of said at least one intermediate layer coupling said chip and said antenna element;

(f) providing vias extending through the major surfaces of said at least one intermediate layer having electrically conductive material therein for interconnection with a layer intimate with said intermdiate layer; and (g) cofiring said layers at a temperature of from about 1500° C. to about 1800° C. to remove said binder and cause sintering of said layers.

* * * * *